US011574567B2

(12) United States Patent
Wang et al.

(10) Patent No.: US 11,574,567 B2
(45) Date of Patent: Feb. 7, 2023

(54) DISPLAY PANEL, DISPLAY APPARATUS AND CRACK DETECTION METHOD THEREFOR

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Yu Wang, Beijing (CN); Yi Zhang, Beijing (CN); Tingliang Liu, Beijing (CN); Shun Zhang, Beijing (CN); Tinghua Shang, Beijing (CN); Huijuan Yang, Beijing (CN); Pengfei Yu, Beijing (CN); Yang Zhou, Beijing (CN); Linhong Han, Beijing (CN); Xiaofeng Jiang, Beijing (CN); Hao Zhang, Beijing (CN); Huijun Li, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 7 days.

(21) Appl. No.: 17/333,327

(22) Filed: May 28, 2021

(65) Prior Publication Data
US 2021/0375173 A1 Dec. 2, 2021

(30) Foreign Application Priority Data

May 29, 2020 (CN) .......................... 202010478249.9

(51) Int. Cl.
*G09G 3/00* (2006.01)
*H01L 27/32* (2006.01)

(52) U.S. Cl.
CPC ......... *G09G 3/006* (2013.01); *H01L 27/3276* (2013.01)

(58) Field of Classification Search
CPC ........... G09G 3/006; G09G 2300/0426; G09G 2300/0814; G09G 2300/0866; G09G 3/3233; G09G 3/3266; H01L 27/3276
See application file for complete search history.

(56) References Cited

U.S. PATENT DOCUMENTS

| | | |
|---|---|---|
| 2016/0240157 A1* | 8/2016 | Aoki ..................... G09G 3/3648 |
| 2018/0233436 A1* | 8/2018 | Lee ...................... G02F 1/13452 |
| 2020/0025820 A1* | 1/2020 | Zhao ..................... G09G 3/3225 |

* cited by examiner

*Primary Examiner* — Mark W Regn
(74) *Attorney, Agent, or Firm* — Dority & Manning, P.A.

(57) ABSTRACT

A display panel includes a plurality of sub-pixels and a plurality of data lines, and a detection circuit. The data lines include at least one first data line. The detection circuit includes a first detection signal line, a detection control signal line, and at least one first switch. The first detection signal line and the detection control signal line detour along an edge of the active area. The first detection signal line is configured to transmit a detection signal, and the detection control signal line is configured to transmit a detection control signal. The first switch is electrically connected to the first detection signal line, the detection control signal line, and the at least one first data line, and is configured to close a line between the first detection signal line and the first data line, in response to the detection control signal.

16 Claims, 10 Drawing Sheets

DISPLAY PANEL, DISPLAY APPARATUS AND CRACK DETECTION METHOD THEREFOR

CROSS-REFERENCE TO RELATED APPLICATION

This application claims priority to Chinese Patent Application No. 202010478249.9, filed May 29, 2020, which is incorporated herein by reference in its entirety.

TECHNICAL FIELD

The present disclosure relates to display technologies, and in particular, to a display panel, a display apparatus and a crack detection method therefor.

BACKGROUND

At present, with the development of the organic light-emitting diode (OLED) display technology, active-matrix organic light-emitting diodes (AMOLEDs) have been more and more widely applied to various display apparatuses. In particular, flexible AMOLED display apparatuses have broad application prospects in wearable products due to its advantages of being bendable, high brightness and high contrast.

SUMMARY

In an aspect, a display panel is provided. The display panel includes an active area and a peripheral area, and the active area is at least partially surrounded by the peripheral area. The display panel includes a plurality of sub-pixels located in the active area, a plurality of data lines located in the active area and electrically connected to the plurality of sub-pixels, a detection circuit located in the peripheral area. The plurality of data lines include at least one first data line. The detection circuit includes a first detection signal line, a detection control signal line and at least one first switch. The first detection signal line detours along an edge of the active area and is configured to transmit a detection signal. The detection control signal line detours along the edge of the active area and is configured to transmit a detection control signal. The at least one first switch is electrically connected to the first detection signal line, the detection control signal line and the at least one first data line, and is configured to close a line between the first detection signal line and the first data line, in response to the detection control signal.

In some embodiments, the data lines further includes at least one second data line. The detection circuit further includes a second detection signal line detouring along the edge of the active area and at least one second switch. The second detection signal line is arranged between the first detection signal line and the detection control signal line; the at least one second switch is electrically connected to the second detection signal line, the detection control signal line and the at least one second data line, and is configured to close a line between the second detection signal line and the second data line, in response to the detection control signal.

In some embodiments, the first detection signal line, the second detection signal line, and the detection control signal line are arc-shaped lines.

In some embodiments, the detection circuit further includes at least one crack detection line located in the peripheral area and on a side of the first detection signal line away from the active area. The at least one crack detection line is electrically connected between the first detection signal line and the second detection signal lines.

In some embodiments, the first detection signal line is a one-piece line. The at least one crack detection line includes a first crack detection line and a second crack detection line that are located in the peripheral area. The first crack detection line and the second crack detection line are located on the side of the first detection signal line away from the active area, and are located on different sides of a central axis of the active area; a first terminal of the first crack detection line is electrically connected to a first terminal of the first detection signal line, and a second terminal of the first crack detection line is electrically connected to a first terminal of the second detection signal line; and a first terminal of the second crack detection line is electrically connected to a second terminal of the first detection signal line, and a second terminal of the second crack detection line is electrically connected to a second terminal of the second detection signal line.

In some embodiments, the first crack detection line and the second crack detection line each include a first wire segment, a second wire segment, a third wire segment, and a fourth wire segment. The first wire segment is arc-shaped, detouring along the first detection signal line. The second wire segment is electrically connected to the first terminal of the second detection signal line. The second wire segment is arc-shaped, and is arranged on a side of the first wire segment away from the active area, detouring along the first wire segment. The third wire segment is electrically connected between the first wire segment and the second wire segment. The fourth wire segment is electrically connected between the first wire segment and the first detection signal line.

In some embodiments, the first detection signal line includes a first detection signal sub-line and a second detection signal sub-line. The first detection signal sub-line and the second detection signal sub-line are located on different sides of a central axis of the active area, respectively. The first detection signal sub-line and the second detection signal sub-line are located on different sides of a central axis of the active area, respectively. The detection circuit further includes a first crack detection line located in the peripheral area and a second crack detection line located in the peripheral area. The first crack detection line and the second crack detection line are located on the side of the first detection signal line away from the active area, and are located on different sides of a central axis of the active area; a first terminal of the first crack detection line is electrically connected to a first terminal of the first detection signal sub-line, and a second terminal of the first crack detection line is electrically connected to a first terminal of the second detection signal line; a first terminal of the second crack detection line is electrically connected to a first terminal of the second detection signal sub-line, and a second terminal of the second crack detection line is electrically connected to a second terminal of the second detection signal line; and a second terminal of the first detection signal sub-line and a second terminal of the second detection signal sub-line are located on different sides of the central axis of the active area and are opposite to each other.

In some embodiments, the first crack detection line and the second crack detection line each include a first wire segment, a second wire segment, a third wire segment, and a fourth wire segment. The first wire segment is arc-shaped, detouring along the first detection signal line. The second wire segment is electrically connected to the first terminal of the second detection signal line. The second wire segment is arc-shaped, and is arranged on a side of the first wire segment away from the active area, detouring along the first wire segment. The third wire segment is electrically connected between the first wire segment and the second wire segment. The fourth wire segment is electrically connected between the first wire segment and the first detection signal line.

In some embodiments, the at least one crack detection line includes a first crack detection line and a second crack detection line. The first crack detection line and the second crack detection line are located on the side of the first detection signal line away from the active area, and are located on different sides of a central axis of the active area, and both are double broken lines.

In some embodiments, the display panel further includes a bonding region located in the peripheral area. The detection circuit further includes at least one first signal input terminal and at least one second signal input terminal that are both arranged in the bonding region. The at least one first signal input terminal is electrically connected to the first detection signal line and the second detection signal line, and is configured to transmit the detection signal to the first detection signal line and the second detection signal line. The at least one second signal input terminal is electrically connected to the detection control signal line, and is configured to transmit the detection control signal to the detection control signal line.

In some embodiments, the at least one first switch and the at least one second switch are located on a side of the active area away from the bonding region, and are arranged along the detection control signal line.

In some embodiments, the active area includes at least one arc-shaped edge.

In some embodiments, the display panel further includes a plurality of multiplexing data signal lines, a plurality of multiplexing sub-circuits, and a plurality of data signal input terminals. The multiplexing data signal lines are located in the peripheral area, detouring along the edge of the active area. The multiplexing sub-circuits are located in the peripheral area. The data signal input terminals are located in the bonding region and configured to output data signals. The multiplexing data signal lines are electrically connected to the data signal input terminals in one-to-one correspondence; and one multiplexing sub-circuit is electrically connected to one multiplexing data signal line and at least two data lines, and the multiplexing sub-circuit is configured to transmit at least two data signals to the at least two data lines in a time-sharing manner.

In some embodiments, the multiplexing sub-circuit includes a plurality of multiplexing control lines, a plurality of third switches, and a plurality of multiplexing control terminals. The plurality of multiplexing control lines are located in the peripheral area, detouring along the edge of the active area. The plurality of multiplexing control terminals are arranged in the bonding region. The multiplexing control lines are electrically connected to the multiplexing control terminals in one-to-one correspondence, and one third switch is electrically connected to one multiplexing control line, one multiplexing data signal line and one data line, and the multiplexing control line is configured to close a line between a corresponding multiplexing data signal line and the data line in a data writing period of sub-pixels that corresponds to the data line, in response to a multiplexing control signal from the multiplexing control line.

In some embodiments, the first detection signal line detours along a side of the detection control signal line away from the active area.

In another aspect, a display apparatus is provided. The display apparatus includes the display panel according to any one of the above embodiments. The display panel further includes a bonding region located in the peripheral area and at least one detection chip. The at least one detection chip is electrically connected to the first detection signal line and the detection control signal line in the bonding region, and is configured to transmit the detection signal to the first detection signal line and the detection control signal line.

In some embodiments, the detection circuit further includes a second detection signal line and at least one second switch. The second detection signal line is arranged between the first detection signal line and the control signal line; the at least one second switch is electrically connected to the second detection signal line, the detection control signal line, and the at least one second data line, and is configured to close a line between the second detection signal line and the second data line, in response to the detection control signal. The at least one detection chip is further electrically connected to the second detection signal line in the bonding region, and is further configured to output the detection signal to the second detection signal line.

In some embodiments, the detection circuit further includes at least one first signal input terminal and at least one second signal input terminal. The at least one detection chip is electrically connected to the first detection signal line, the second detection signal line, and the detection control signal line through the at least one first signal input terminal and the at least one second signal input terminal.

In yet another aspect, a crack detection method applied to the display apparatus according to any one of the above embodiments is provided. The plurality of sub-pixels include a plurality of pixel driver circuits. The crack detection method includes: resetting the plurality of pixel driver circuits; transmitting the detection control signal to the at least one first switch through the detection control signal line, so as to close the line between the first detection signal line and the first data line; and transmitting the detection signal to the first data line through the first detection signal line.

BRIEF DESCRIPTION OF THE DRAWINGS

In order to describe technical solutions in the present disclosure more clearly, accompanying drawings to be used in some embodiments of the present disclosure will be introduced briefly. However, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products, an actual process of a method and actual timings of signals to which the embodiments of the present disclosure relate.

DETAILED DESCRIPTION

Figure 1:
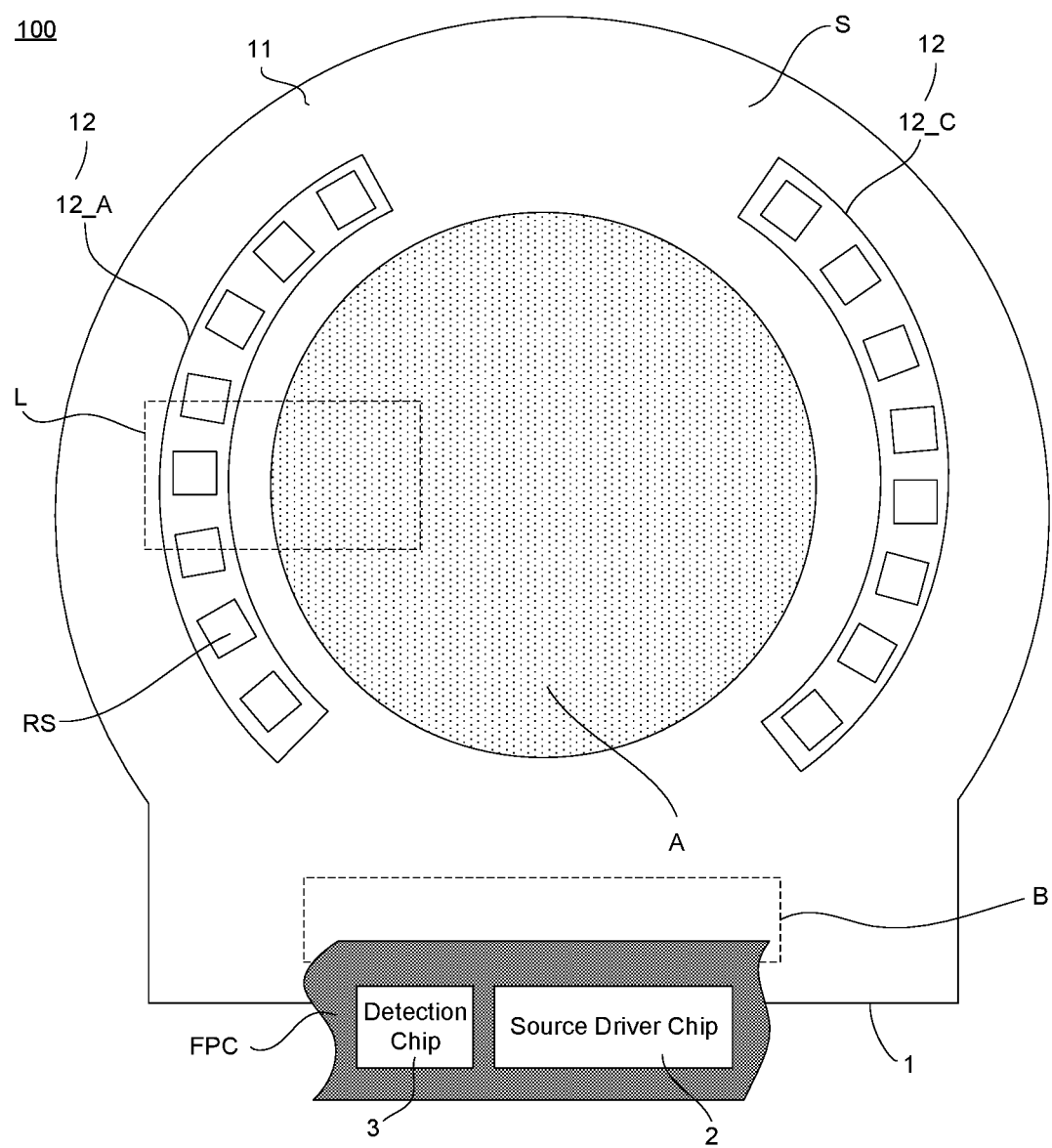
FIG. 1 is a schematic top view of a display apparatus, in accordance with some embodiments.

Technical solutions in some embodiments of the present disclosure will be described clearly and completely with reference to the accompanying drawings below. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to." In the description, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms "first" and "second" are used for descriptive purposes only, and are not to be construed as indicating or implying the relative importance or implicitly indicating the number of indicated technical features. Thus, features defined as "first" and "second" may explicitly or implicitly include one or more of the features. In the description of the embodiments of the present disclosure, the term "a plurality of" means two or more unless otherwise specified.

In the description of some embodiments, the term "connected" and its extensions may be used. For example, the term "electrically connected" may be used in the description of some embodiments to indicate that two or more components are in direct electrical contact with each other, or they are in electrical contact with each other through another intermediate component. The embodiments disclosed herein are not necessarily limited to the contents herein.

The phrase "at least one of A, B and C" has the same meaning as the phrase "at least one of A, B or C", and both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The term "substantially" or "approximately" as used herein includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

Referring to FIG. 1, some embodiments of the present disclosure provide a display panel 1, which may be used in a mobile phone, a tablet computer, a notebook computer, a personal digital assistant (PDA), a vehicle-mounted computer, and a wearable device. The display panel 1 may be a liquid crystal display panel or an organic light-emitting diode (OLED) display panel. In a case where the display panel 1 is used in a wearable device such as a watch or a bracelet, the display panel 1 may be in a shape with an arc-shaped edge, such as a circular shape or an elliptical shape.

Figure 2:
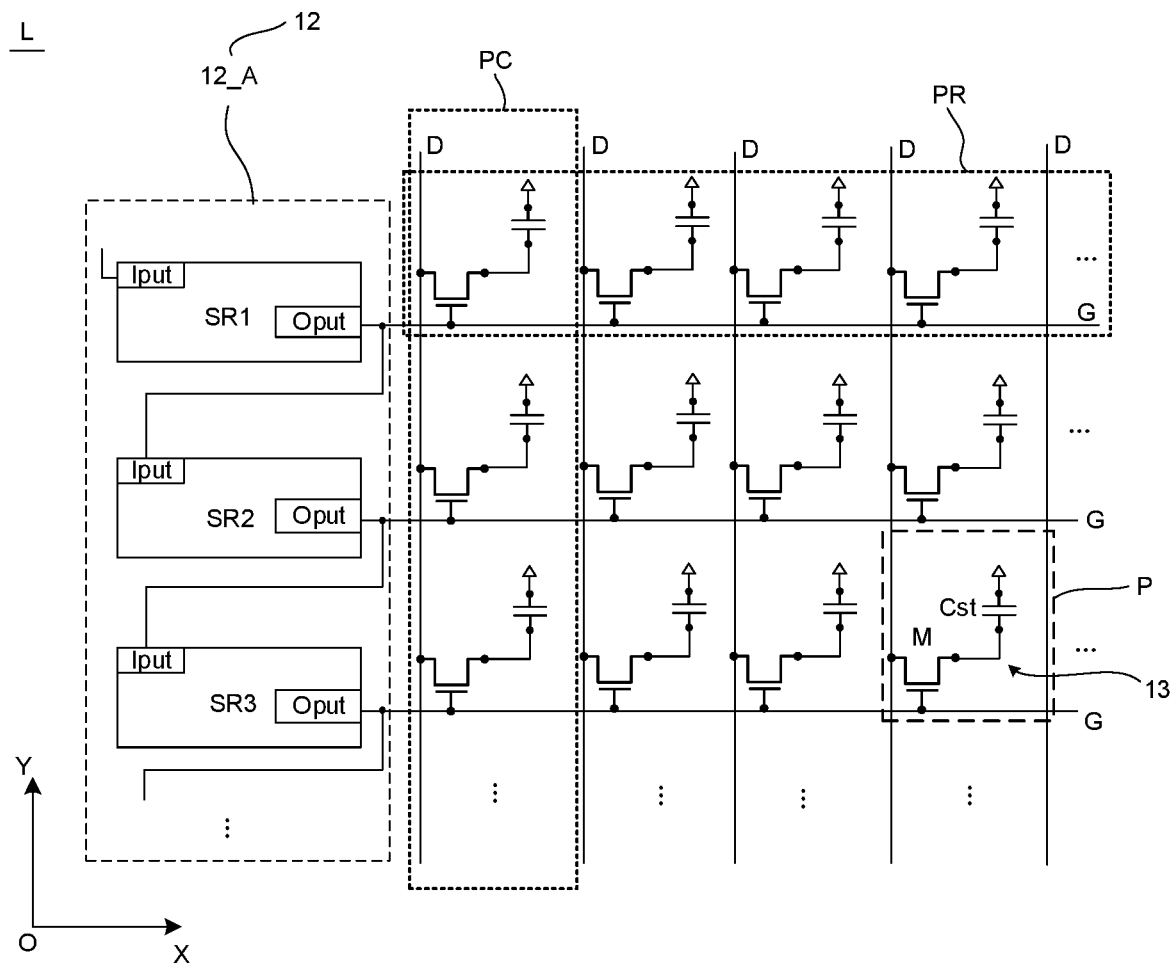
FIG. 2 is a local enlarged schematic diagram of the region L of the display apparatus shown in FIG. 1.

In some embodiments, as shown in FIGS. 1 and 2, the display panel 1 has an active area A and a peripheral area S, and the active area A is at least partially surrounded by the peripheral area S. Referring to FIG. 1, the display panel 1 includes a base substrate 11, and a plurality of gate lines G and a plurality of data lines D that are arranged on the base substrate 11 and in the active area A. Orthogonal projections of the gate lines G and the data lines D on the base substrate 11 intersect each other, and a region defined by orthogonal projections of a gate line G and a data line D is defined as a sub-pixel region.

Referring to FIGS. 1 and 2, the display panel 1 further includes a plurality of sub-pixels P, and each sub-pixel P is arranged in a respective sub-pixel region. For example, the sub-pixels P in FIG are arranged in an array. Sub-pixels P arranged in a line in a first direction OX are defined as a sub-pixel row PR, and sub-pixels P arranged in a line in a second direction OY are defined as a sub-pixel column PC, where the first direction OX is substantially perpendicular to the second direction OY. Each gate line G is electrically connected to a corresponding sub-pixel row, and each data line D is electrically connected to a corresponding sub-pixel column PC.

For example, as shown in FIG. 1, the display panel 1 further includes at least one gate driver circuit 12 arranged in the peripheral area S. It will be noted that, the at least one gate driver circuit 12 may be formed on the display panel 1, which is referred as gate on array (GOA) technology.

In some embodiments, as shown in FIG. 1, the at least one gate driver circuit 12 is configured to provide gate signals (e.g., a first gate signal N-1 and/or a second gate signal N) and/or light-emitting control signals $V_{EM}$ to the plurality of sub-pixels P in the display panel 1. For example, the at least one gate driver circuit 12 includes a first gate driver circuit 12_A for outputting the first gate signal N-1 and the second gate signal N, and a second gate driver circuit 12_C for outputting the light-emitting control signals $V_{EM}$.

Referring to FIG. 2, a connection relationship among a plurality of cascaded shift registers RS included in the gate driver circuit 12 will be illustrated by taking the first gate driver circuit 12_A as an example. For a connection relationship among shift registers RS included in the second gate driver circuit 12_C, reference may be made to the first gate driver circuit 12_A and FIG. 5.

The first gate driver circuit 12_A includes the cascaded shift registers RS. A signal output terminal Oput of each shift register SR is electrically connected to a respective gate line G, and is configured to provide gate driving signals to sub-pixels P in a sub-pixel row PR corresponding to the gate line G.

On this basis, for example, as shown in FIG. 1, the plurality of shift registers RS are arranged along an edge of the active area A. As shown in FIG. 2, in any two adjacent stages of shift registers RS, a signal output terminal Oput of a previous-stage shift register SR is connected to a signal input terminal Iput of a next-stage shift register SR. For example, as shown in FIG. 2, a first-stage shift register SR1, a second-stage shift register SR2, and a third-stage shift register SR3 are sequentially arranged in the edge of the active area A. A signal output terminal Oput of the first-stage shift register SR1 is connected to a signal input terminal Iput of the second-stage shift register SR2, and a signal output terminal Oput of the second-stage shift register SR2 is connected to a signal input terminal Iput of the third-stage shift register SR3.

In the gate driver circuit 12, a signal input terminal Iput of the first-stage shift register SR1 may receive a start vertical frame signal STV. A working process of the gate driver circuit 12 will be exemplarily described below by taking an example in which a high-level signal is an active level signal of the first-stage shift register SR1, that is, when the start vertical frame signal STV is at a high-level, the first-stage shift register SR1 is turned on, and when the start vertical frame signal STV is at a low-level, the first-stage shift register SR1 is turned off.

The first-stage shift register SR1 outputs a signal to sub-pixels P in a first sub-pixel row PR and the signal input terminal Iput of the second-stage shift register SR2. Herein, the signal serves as a gate driving signal for the sub-pixels P in the first sub-pixel row, and a start signal for the second-stage shift register SR2 to turn on the second-stage shift register SR2.

The second-stage shift register SR2 outputs a signal to sub-pixels P in a second sub-pixel row PR and the signal input terminal Iput of the third-stage shift register SR3. Herein, the signal serves as a gate driving signal for the sub-pixels P in the second sub-pixel row PR, and a start signal for the third-stage shift register SR3 to turn on the third-stage shift register SR3.

The third-stage shift register SR3 outputs a signal to sub-pixels P in a third sub-pixel row PR and a signal input terminal Iput of a next-stage shift register cascaded with the third-stage shift register SR3. Herein, the signal serves as a gate driving signal for the sub-pixels P in the third sub-pixel row, and a start signal for the next-stage shift register cascaded with the third-stage shift register SR3 to turn on the third-stage shift register SR3.

In this way, through the plurality of cascaded shift registers RS, the plurality of sub-pixels P arranged in the array may be scanned row by row.

It will be noted that, the above descriptions are all described by taking an example in which one stage of shift register SR of the gate driver circuit 12 controls scanning of one sub-pixel row. In some other embodiments, one stage of shift register SR may control scanning of at least two sub-pixel rows PR (or sub-pixel columns PC), and an internal structure of the shift register SR is not limited herein.

Figure 3:
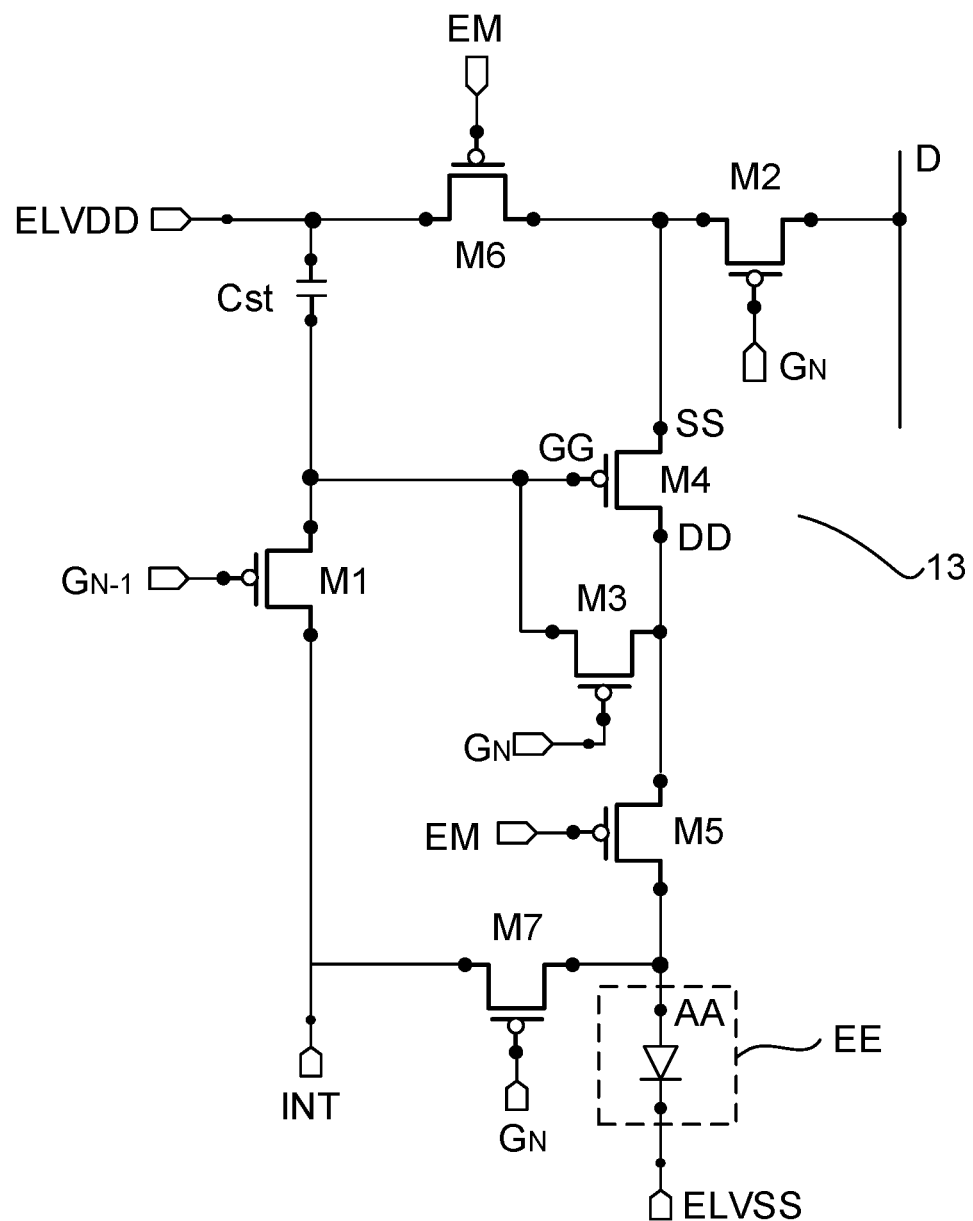
FIG. 3 is a schematic diagram of a pixel driver circuit, in accordance with some embodiments.

Referring to FIGS. 2 and 3, each sub-pixel P includes a pixel driver circuit 13 and a light-emitting device EE connected thereto. The pixel driver circuit 13 will be exemplarily described with reference to FIG. 3. The pixel driver circuit 13 includes the capacitor Cst, a plurality of switching transistors, i.e., M1, M2, M3, M5, M6 and M7, and a driving transistor M4. The pixel driver circuit 13 is configured to drive the corresponding light-emitting device EE to emit light.

A gate of the switching transistor M1 is connected with a first gate signal terminal $G_{N-1}$, gates of the switching transistors M2, M3 and M7 are all connected with the second gate signal terminal $G_N$; and gates of the switching transistors M5 and M6 are both connected with a light-emitting control signal terminal EM.

Figure 4:
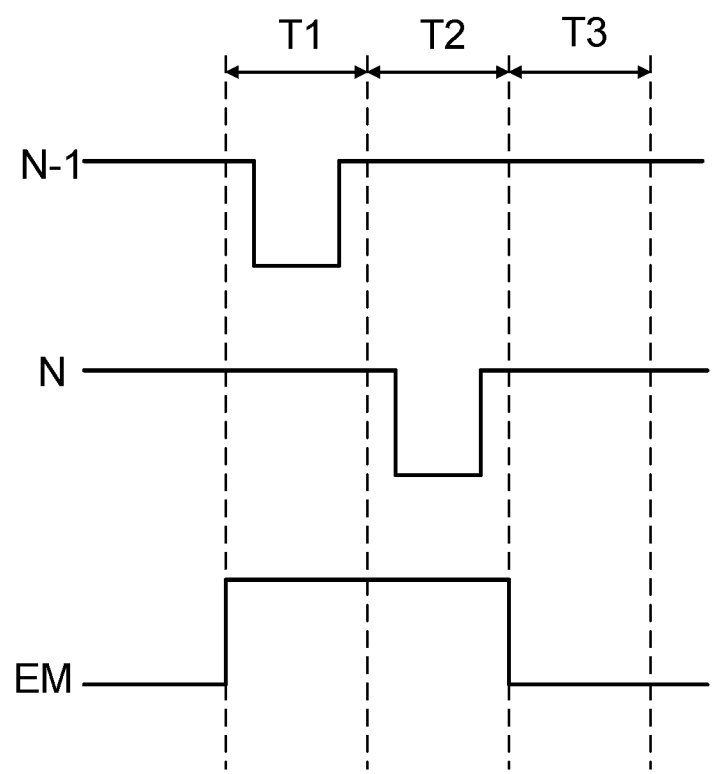
FIG. 4 is a signal timing diagram for the pixel driver circuit shown in FIG. 3.

A driving process of the corresponding sub-pixel P by the pixel driver circuit 13 will be exemplarily described with reference to FIGS. 3 and 4. The driving process includes three periods shown in FIG. 4, i.e., a first period T1, a second period T2 and a third period T3. In addition, it is taken as an example that the switching transistors M1, M2, M3, M5, M6 and M7, and the driving transistor M4 are all P-type transistors herein. In other words, these transistors are turned on when the gates thereof receive low-level signals, and turned off when the gates thereof receive high-level signals.

In the first period T1, when the first gate signal N-1 from the first gate signal terminal $G_{N-1}$ is at the low-level, the switching transistor M1 is turned on. Accordingly, an initial voltage Vint from an initial voltage terminal INT is transmitted to a gate GG of the driving transistor M4 and a terminal of the capacitor Cst via the switching transistor M1, so that voltages of the gate GG of the driving transistor M4 and the capacitor Cst are reset.

In the second period T2, when the second gate signal N from the second gate signal terminal $G_N$ is at the low-level, the switching transistors M2, M3 and M7 are turned on, so that the initial voltage Vint is transmitted to an anode AA of the corresponding light-emitting device EE via the switching transistor M7. Since the switching transistor M3 is turned on, a current path is formed between the gate GG and a drain DD of the driving transistor M4, and the driving transistor M4 is in a turn-on state. In addition, a data signal Vdata from a corresponding data line D is written into the capacitor Cst via the switching transistor M2, the driving transistor M4 and the switching transistor M3. The written data signal Vdata is compensated during this writing process, where compensation value is a threshold voltage Vth of the driving transistor M4.

In the third period T3, when the light-emitting control signal Von from the light-emitting control signal terminal EM is at the low-level, the switching transistor M5, the switching transistor M6 and the driving transistor M4 are turned on, so that a current path is formed between a first voltage terminal ELVDD and a second voltage terminal ELVSS, and a driving current ID is transmitted to the corresponding light-emitting device EE through the current path, which enables the light-emitting device EE to emit light.

Figure 5:
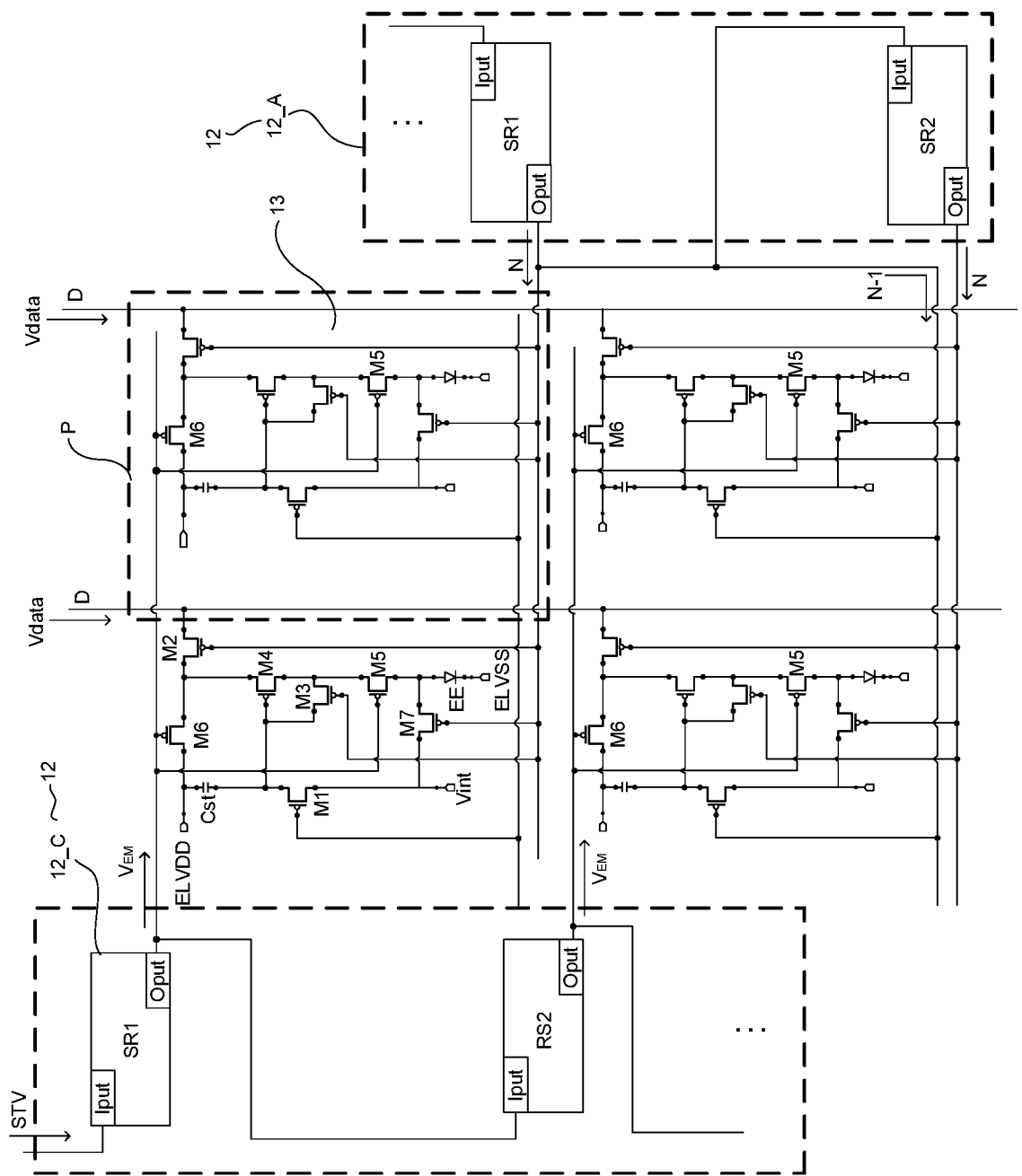
FIG. 5 is a schematic diagram illustrating connection between a gate driver circuit and a pixel driver circuit in a display panel, in accordance with some embodiments.

For example, as shown in FIGS. 2, 3 and 5, among the pixel driver circuit 13 in a same sub-pixel row PR, the gates of the switching transistors M5 and M6 are connected to a signal output terminal Oput of a shift register RS in the second gate driver circuit 12_C; the gates of the switching transistors M2, M3 and M7 are connected to a signal output terminal Oput of a shift register RS in the first gate driver circuit 12_A; the gate of the switching transistor M1 is connected to a signal output terminal Oput of another shift register RS in the first gate driver circuit 12_A.

In addition, it will be noted that, since the plurality of shift registers RS in each gate drive circuit 12 are cascaded, in an image frame, the shift registers RS in the gate driver circuit 12 output gate driving signals one by one through respective signal output terminals Oput. In this case, all sub-pixel rows in the active area A may be scanned row by row, which enables the display panel 1 to display an image.

Figure 7A:
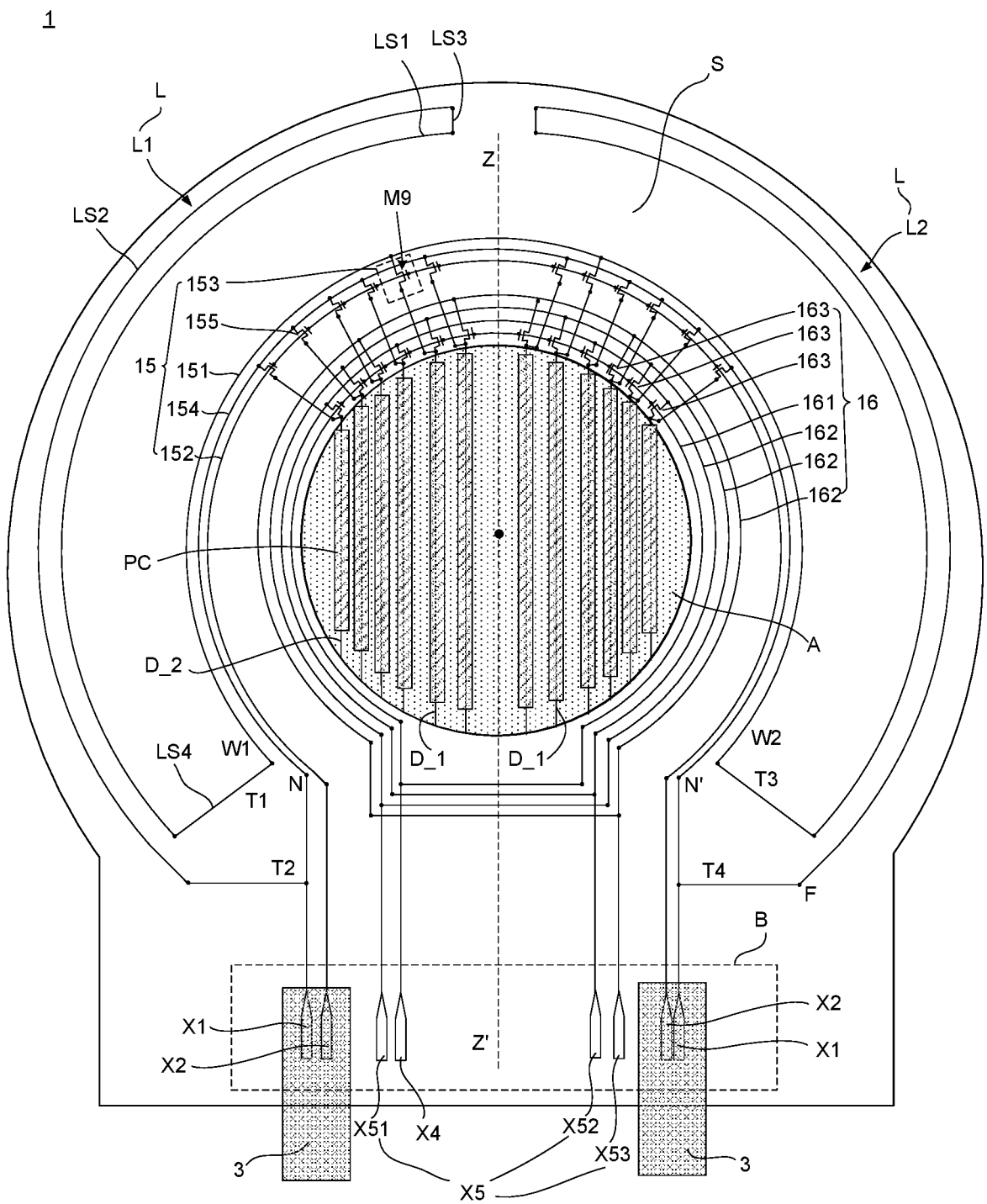
FIG. 7A is a schematic top view of another display panel, in accordance with some embodiments.
Figure 7B:
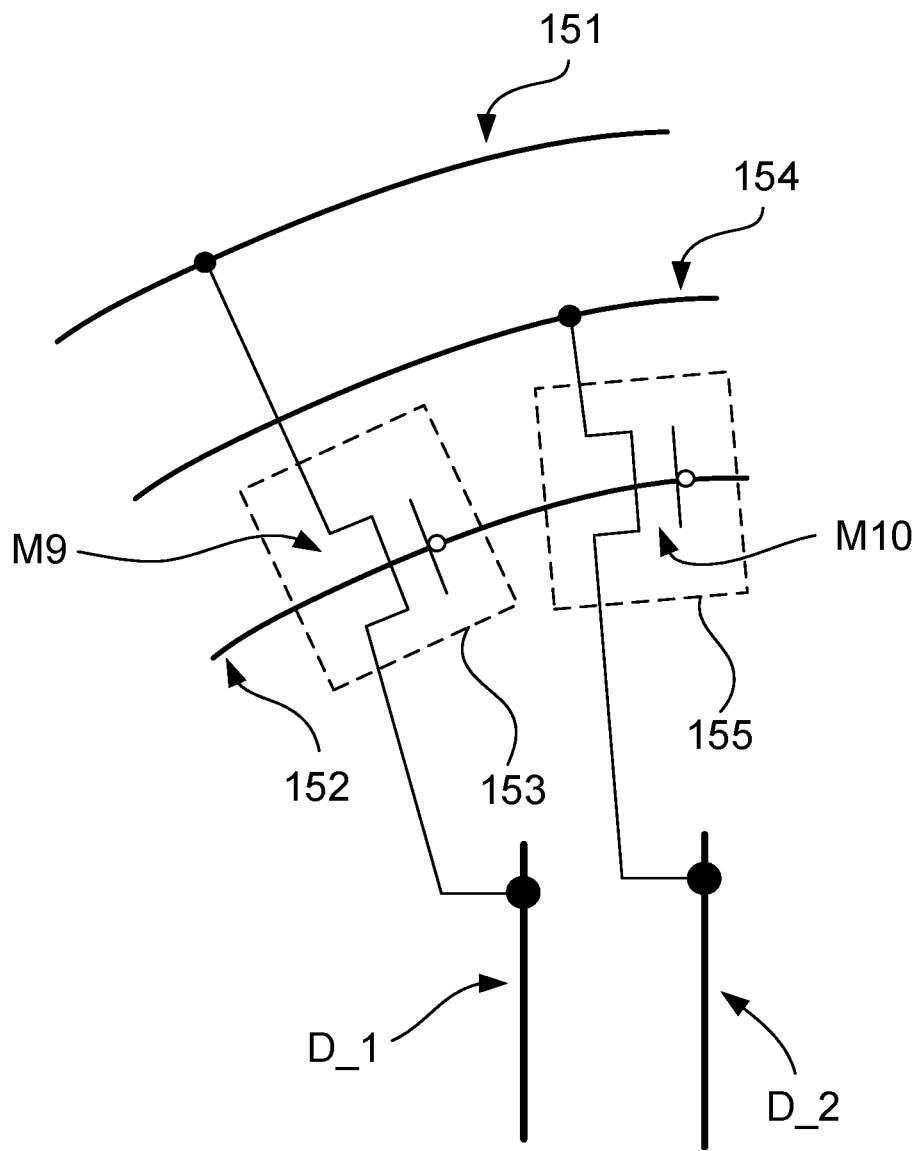
FIG. 7B is a local enlarged schematic diagram of the display panel shown in FIG. 7A.

In some embodiments, as shown in FIGS. 7A and 7B, the display panel 1 further includes a detection circuit 15 arranged in the peripheral area S. The plurality of data lines D include at least one first data line D_1, and each first data line D_1 is electrically connected to a respective one of the plurality of sub-pixel columns PC.

Referring to FIGS. 7A and 7B, the detection circuit 15 includes a first detection signal line 151, a detection control signal line 152, and at least one first switch 153. The first detection signal line 151 and the detection control signal line 152 both detour along the edge of the active area A. The first detection signal line 151 is configured to transmit a detection signal, and the detection control signal line 152 is configured to transmit a detection control signal. Each first switch 153 is electrically connected to the first detection signal line 151, the detection control signal line 152 and a respective first data line D_1, and is configured to close a line between the first detection signal line 151 and the first data line D_1, in response to the detection control signal from the detection control signal line 152.

The display panel 1 has a panel crack detection function. During the detection, the detection signal may be transmitted to the at least one first switch 153 through the first detection signal line 151. In a case where the at least one first switch 153 is turned on in response to the detection control signal, the detection signal is transmitted to the at least one first data line D_1 via the at least one turned-on first switch 153.

It will be noted that, since the first detection signal line 151 is arranged in the peripheral area S and detoured along the edge of the active area A, in a case where there is a defect such as a crack in the peripheral area S of the display panel 1, there is a high probability that the first detection signal line 151 is incapable of transmitting the detection signal to the first data line D due to a breakage thereof caused by the defect, for example, the crack in the peripheral area S of the display panel 1 may cause the first detection signal line 151 to break. In this case, the sub-pixel column PC connected to the at least one first data line D_1 is incapable of receiving the detection signal, which may cause the sub-pixel column PC to emit light. At this time, the display panel 1 displays a preset image (e.g., a bright line pattern) or presents preset brightness. In this way, it is possible to determine whether the first detection signal line 151 is broken according to the image displayed on or the brightness of the display panel 1 during the detection, thereby detecting whether there is a crack in the display panel 1.

For example, the display panel 1 has a brightness difference between a situation of displaying the preset image and a situation of not displaying the preset image. Thus the crack detection to the display panel 1 may be achieved by a device capable of detecting the brightness of the display panel 1, such as an optical sensor.

In another example, the crack detection to the display panel 1 may also be achieved by recognizing whether the display panel 1 presents the preset image through a device capable of recognizing the preset image, or human eyes.

For example, referring to FIGS. 7A and 7B, each first switch 153 includes a switching transistor M9. A gate of the switching transistor M9 is connected to the detection control signal line 152, a first electrode thereof is connected to the first detection signal line 151, and a second electrode thereof is connected to the first data line D_1.

The detection process will be exemplarily described below by taking an example in which the switching transistor M9 is a P-type transistor, that is, the switching transistor M9 is turned on when the gate thereof receives a low-level signal, and is turned off when the gate thereof receives a high-level signal.

The detection process includes a reset period, a detection signal writing period, and a light-emitting period.

Referring FIG. 3, for the pixel driver circuit 13, the reset period is the same as the first period T1 of the driving process thereof. That is, during the reset period, the first strobe signal N-1 is at the low-level, and the switching transistor M1 is turned on; the initial voltage Vint from the initial voltage terminal INT is transmitted to the gate GG of the driving transistor M4 and the terminal, connected to the driving transistor M4, of the capacitor Cst via the switching transistor M1, so that the voltages of the gate GG of the driving transistor M4 and the capacitor Cst are reset. Herein, during the reset period, the initial voltage Vint is at the low-level. In this way, after the reset period, the voltage of the terminal, connected to the driving transistor M4, of the capacitor Cst is substantially equal to a voltage of the low-level.

In the detection signal writing period, in a case where the first detection signal line 151 is not broken, that is, in a case where there is no crack in the peripheral area S of the display panel 1, the detection signal may be transmitted to the corresponding first data line D_1 through the first detection signal line 151, and then the detection signal is written into the capacitor Cst. Herein, the detection signal is a high-level signal. It will be noted that, the detection signal writing period is similar to the second period T2 of the driving process, except that in the second period T2, what is written into the capacitor Cst is the data signal Vdata, whereas in the detection signal writing period, in the case where there is no crack in the peripheral area S, what is written into the capacitor Cst is the detection signal at the high level, and in the case where there is a crack in the display panel 1, no signal is written into the capacitor Cst.

In the light-emitting period, the light-emitting control signal Von is at the low-level, and the switching transistor M5, the switching transistor M6 and the driving transistor M4 are turned on. In the case where there is no crack in the peripheral area S of the display panel 1, the voltage of the gate GG of the driving transistor M4 is equal to the voltage of the high-level. Therefore, the driving transistor M4 is in a turn-off state, the sub-pixel column PC in correspondence with the first data line D_1 does not emit light, and the preset image (e.g., the bright line pattern) does not appear on the display panel 1. However, in the case where there is a crack in the peripheral area S of the display panel 1, since no signal is written into the capacitor Cst in the previous detection signal writing period, the voltage of the gate GG of the driving transistor M4 is still substantially maintained at the voltage of the reset period, that is, the voltage of the gate GG of the driving transistor M4 is still equal to the voltage of the low-level, so that the driving transistor M4 is still in a turn-on state, and the light-emitting device EE of the sub-pixel P emits light. Similarly, other sub-pixels P in the same sub-pixel column PC also emit light, and thus the preset image appears on the display panel 1.

As a result, in a case where the first detection signal line 151 is broken due to the crack in the peripheral area S, the sub-pixel column PC in correspondence with the first data line D_1 emits light, whereas in the case where there is no crack in the peripheral area S, the sub-pixel column PC in correspondence with the first data line D_1 does not emit light. Therefore, it is possible to detect whether there is a crack in peripheral area S of the display panel 1 according to the light-emitting condition of the sub-pixel column PC corresponding to the first data line D_1.

In some embodiments, as shown in FIGS. 7A and 7B, the plurality of data lines D of the display panel 1 further includes a plurality of second data lines D_2, and each second data line D_2 is electrically connected to a respective one of the plurality of sub-pixel columns PC. The detection circuit 15 further includes a second detection signal line 154 and at least one second switch 155. The second detection signal line 154 detours along the edge of the active area A, and is arranged between the first detection signal line 151 and the detection control signal line 152. Each second switch 155 is connected to the second detection signal line 154, the detection control signal line 152, and a respective second data line D_2, and is configured to close a line between the second detection signal line 154 and the second data line D_2, in response to the detection control signal from the detection control signal line 152.

For example, referring to FIGS. 7A and 7B, the second switch 155 includes a switching transistor M10. A gate of the switching transistor M10 is connected to the detection control signal line 152, a first electrode thereof is connected to the second detection signal line 154, and a second electrode thereof is connected to the second data line D_2.

During a crack detection process of the display panel 1, the at least one first switch 153 and the at least one second switch 155 are controlled by the same detection control signal, and are turned on simultaneously. In the case where there is no crack in the peripheral area S, the detection signal may be transmitted to the corresponding first data line D_1 and the corresponding second data line D_2 through the first detection signal line 151 and the second detection signal line 154, respectively, and the sub-pixel columns PC corresponding to the first data line D_1 and the second data line D_2 do not emit light. However, in the case where there is a crack in the peripheral area S, the sub-pixel column PC corresponding to the first data line D_1 emits light since it does not receive the detection signal, whereas the sub-pixel column PC corresponding to the second data line D_2 does not emit light since it receives the detection signal. Thus, a brightness contrast may be generated between the sub-pixel column PC that emits light and the sub-pixel column PC that does not emit light, thereby facilitating the detection and improving the detection accuracy.

For example, the sub-pixel column PC corresponding to the first data line D_1 is a green sub-pixel column $PC_G$. In this way, under a condition that the detection signal has a substantially constant voltage, light emitted from the green sub-pixel PG has a higher brightness, so that the detection accuracy may be further improved. In addition, in a case where the preset image is recognized through human eyes, since human eyes are more sensitive to green light, the detection accuracy may further be improved.

In some embodiments, referring to FIGS. 7A and 7B, the first detection signal line 151 detours on a side of the second detection signal line 154 away from the active area A, and the second detection signal line 154 detours on a side of the detection control signal line 152 away from the active area A.

Figure 8:
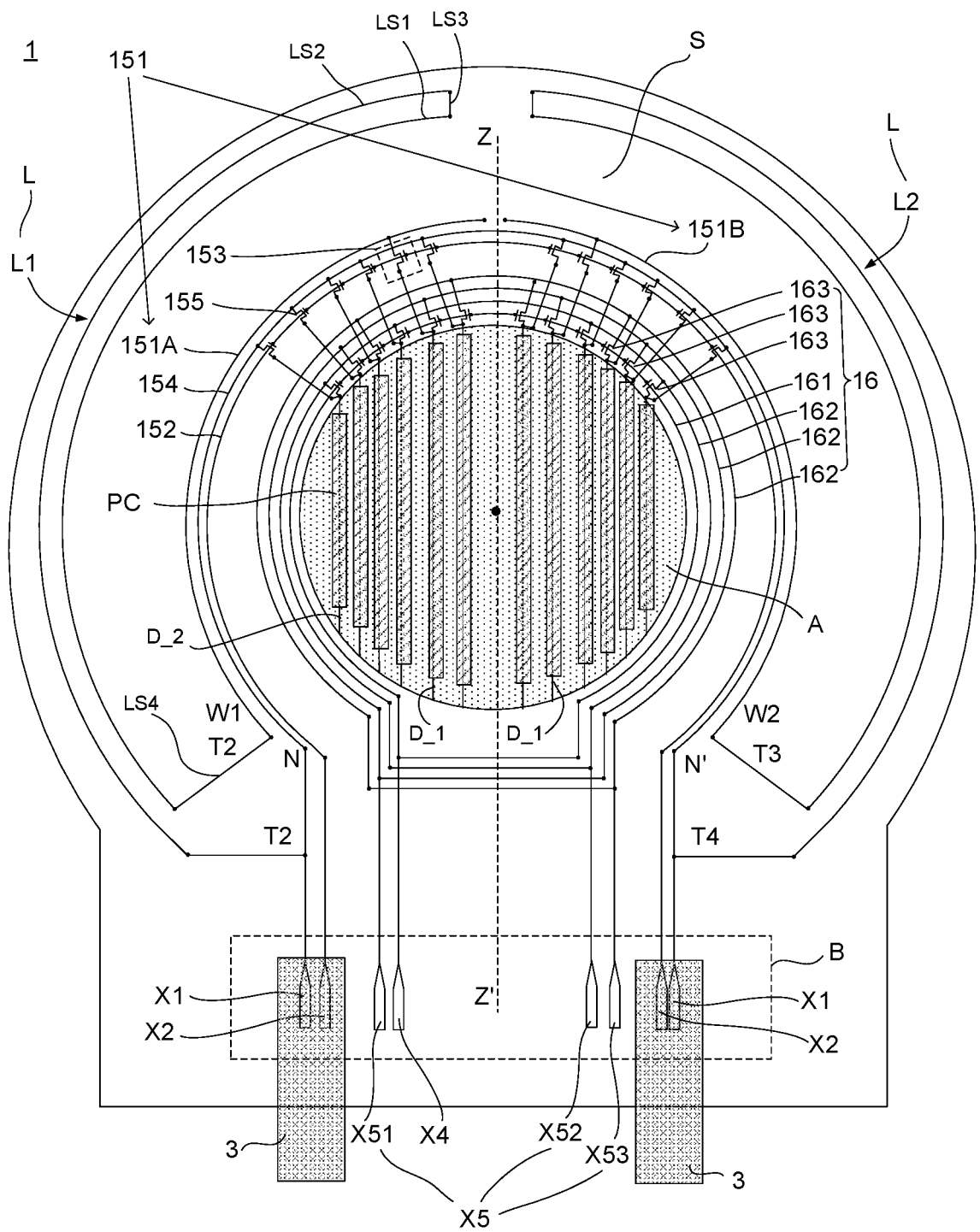
FIG. 8 is a schematic top view of yet another display panel, in accordance with some embodiments.

In some embodiments, as shown in FIGS. 7A and 8, the display panel 1 further includes at least one first signal input terminal X1 arranged in a bonding region B in the peripheral area S. Each first signal input terminal X1 is electrically connected to the first detection signal line 151 and the second detection signal line 154, and is configured to transmit the detection signal to the first detection signal line 151 and the second detection signal line 154.

In some embodiments, as shown in FIGS. 7A and 8, the display panel 1 further includes at least one second signal input terminal X2 arranged in the bonding region B. Each second signal input terminal X2 is electrically connected to the detection control signal line 152, and is configured to transmit the detection control signal to the detection control signal line 152.

Herein, the number of the at least one first signal input terminal X1 and the number of the at least one second signal input terminal X2 are not limited.

For example, referring to FIG. 7A, in a case where the display panel 1 includes two first signal input terminals X1 and two second signal input terminals X2, the two first signal input terminals X1 are located on two different sides of a central axis ZZ' of the display panel 1 respectively, and the two second signal input terminals X2 are also located on the two different sides of the central axis ZZ' respectively. In this way, the detection signal may be simultaneously transmitted from two terminals of the first signal detection line 151 and two terminals of the second detection signal line 154, and the detection control signal may be simultaneously transmitted from two terminals of the detection control signal line 152, thereby reducing the influence of signal losses on the detection accuracy.

In some embodiments, in a case where the display panel 1 further includes at least one first signal input terminal X1, referring to FIG. 7A, the detection circuit 15 further includes at least one crack detection line L. The at least one crack detection line L is arranged in the peripheral area S, and on a side of the first detection signal line 151 away from the active area A. Each crack detection line L is electrically connected between the first detection signal line 151 and a first signal input terminal X1. Herein, the at least one crack detection line L may increase a detection area to the display panel 1, thereby improving the detection accuracy.

In some embodiments, referring to FIG. 7A, in the case where the display panel 1 includes two first signal input terminals X1, and the first detection signal line 151 has a first terminal W1 and a second terminal W2 (i.e., the first detection signal line 151 is an integral signal line), the at least one crack detection line L includes a first crack detection line L1 and a second crack detection line L2. The first crack detection line L1 and the second crack detection line L2 are arranged on different sides of the central axis ZZ'. A first terminal T1 of the first crack detection line L1 is electrically connected to the first terminal W1 of the first detection signal line 151, and a second terminal T2 of the first crack detection line L1 is electrically connected to one of the two first signal input terminals X1. A first terminal T3 of the second crack detection line L2 is electrically connected to the second terminal W2 of the first detection signal line 151, and a second terminal T4 of the second crack detection line L2 is electrically connected to the other one of the two first signal input terminals X1.

In some embodiments, referring to FIG. 7A, the first terminal T1 of the first crack detection line L1 is electrically connected to the first terminal W1 of the first detection signal line 151, and a second terminal T2 of the first crack detection line is electrically connected to a first terminal N of the second detection signal line 154; the first terminal T3 of the second crack detection line L2 is electrically connected to the second terminal W2 of the first detection signal line 151, and the second terminal T4 of the second crack detection line L2 is electrically connected to a second terminal N' of the second detection signal line 154.

In some other embodiments, referring to FIG. 8, the display panel 1 includes two first data lines D_1 and two first switches 153, and the first detection signal line 151 includes a first detection signal sub-line 151A and a second detection signal sub-line 151B that are separated from each other, i.e., the first detection signal sub-line 151A and the second detection signal sub-line 151B are not in direct contact. The first detection signal sub-line 151A is electrically connected to the first terminal T1 of the first crack detection line L1, and is electrically connected to one of the two first data lines D_1 through one of the two first switches 153. The second detection signal sub-line 151B is electrically connected to the first terminal T3 of the second crack detection line L2, and is connected to the other one of the two first data lines D_1 through the other one of the two first switches 153.

For example, the first detection signal sub-line 151A and the second detection signal sub-line 151B are arranged on different sides of the central axis ZZ'.

The first crack detection line L1 and the first detection signal sub-line 151A are located on one side of the central axis ZZ', and the second crack detection line L2 and the second detection signal sub-line 151B are located on the other side of the central axis ZZ'. In this way, during the crack detection process of the display panel 1, in the case where there is a crack, it is possible to detect on which side of the central axis ZZ' the crack locates according to a position of a sub-pixel column PC that emits light. For example, as shown in FIG. 8, when a sub-pixel column PC in correspondence with the first detection signal sub-line 151A emits light, that is, when the sub-pixel column PC on the left side of the central axis ZZ' in FIG. 8 emits light, it may be inferred that the crack locates in a left portion of the display panel 1, where the left portion is on the left side of the central axis ZZ'; when the sub-pixel column PC in correspondence with the second detection signal sub-line 151B emits light, that is, when the sub-pixel column PC on the right side of the central axis ZZ' in FIG. 8 emits light, it may be inferred that the crack occurs in a right portion of the display panel 1, where the right portion is on the right side of the central axis ZZ'.

In some embodiments, both of the first crack detection line L1 and the second crack detection line L2 are double broken lines.

For example, referring to FIGS. 7A and 8, the first crack detection line L1 and the second crack detection line L2 each include a first wire segment LS1 to a fourth wire segment LS4. The first wire segment LS1 is arc-shaped, and detours along the first detection signal line 151. The second wire segment LS2 is arc-shaped, and is electrically connected to a corresponding first signal input terminal X1, the second wire segment LS2 is arranged on a side of the first wire segment LS1 away from the active area A, and detours along the first wire segment LS1. The third wire segment LS3 is electrically connected between the first wire segment LS1 and the second wire segment LS2. The fourth wire segment LS4 is electrically connected between the first wire segment LS1 and the first detection signal line 151.

In some embodiments, as shown in FIGS. 7A and 8, the at least one first switch 153 and the at least one second switch 155 are arranged on a side of active area A away from the bonding region B, and both may be arranged along the detection control signal line 152.

In this way, in a case where the active area A has a circular or circular-like shape, an area of a portion of the peripheral area S proximate to the bonding region B may be reduced, thereby facilitating a decrease in a bezel size of an display apparatus including the display panel 1.

Referring to FIGS. 7A and 8, the active area A may include at least one arc-shaped edge, for example, the active area A is in a circular or circular-like shape. In this case, as shown in FIGS. 7A and 8, the first detection signal line 151, the second detection signal line 154, and the detection control signal line 152 may all be provided as arc-shaped lines, so that these signal lines may be arranged along the edge of the active area A, so as to save the wiring space of the display panel 1.

Figure 6A:
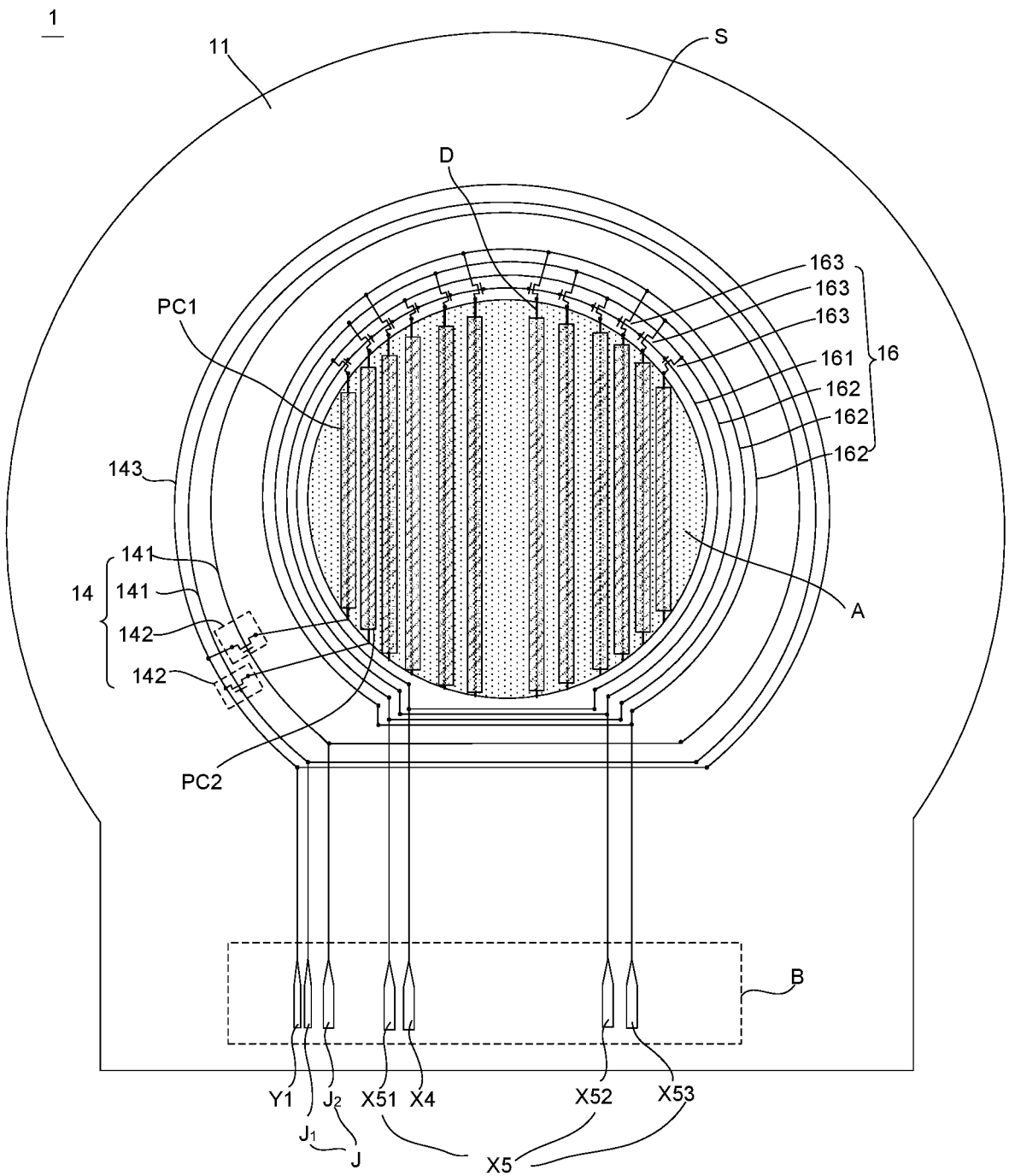
FIG. 6A is a schematic top view of a display panel, in accordance with some embodiments.
Figure 6B:
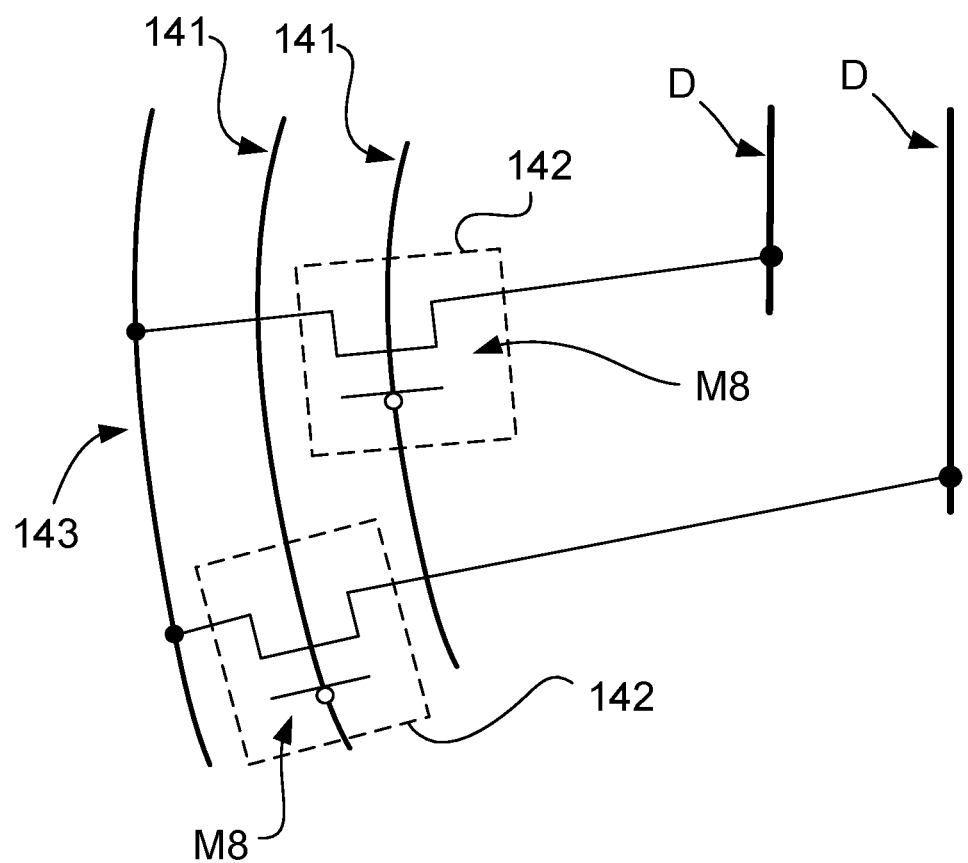
FIG. 6B is a local enlarged schematic diagram of the display panel shown in FIG. 6A.

In some embodiments, referring to FIGS. 6A and 6B, the display panel 1 further includes: a plurality of multiplexing data signal lines 143, a plurality of multiplexing sub-circuits 14 and a plurality of data signal input terminals Y1. The multiplexing data signal lines 143 and the multiplexing sub-circuits 14 are arranged in the peripheral area S, and the data signal input terminals Y1 are arranged in the bonding region B. The multiplexing data signal lines 143 are electrically connected to the data signal input terminals Y1 in one-to-one correspondence. One multiplexing sub-circuit is electrically connected to one multiplexing data signal line 143 and at least two data lines D, and the multiplexing sub-circuit is configured to transmit data signals Vdata to the at least two data lines D in a time-sharing manner.

For example, referring to FIGS. 6A and 6B, the multiplexing sub-circuit 14 includes a plurality of multiplexing control lines 141, a plurality of third switches 142, and a plurality of multiplexing control terminals J. The multiplexing control lines 141 and the third switches 142 are arranged in the peripheral area S, and the multiplexing control terminals J are arranged in the bonding region B. The multiplexing control lines 141 are electrically connected to the multiplexing control terminals J in one-to-one correspondence, and each third switch 142 is electrically connected to a respective multiplexing control line 141, a respective multiplexing data signal line 143 and a respective data line D. The third switch 142 is configured to: close a line between the multiplexing data signal line 143 and the data line D in a data writing period of sub-pixels P electrically connected to the data line D, in response to a multiplexing control signal from the multiplexing control line 142.

Here,

On this basis, in some embodiments, the multiplexing control lines 141 detour along the edge of the active area A, and are sequentially arranged in a direction away from the active area A. The multiplexing data signal lines 143 detour along the multiplexing control lines 141 on a side away from the active area A.

In some embodiments, each multiplexing control line 141 is connected to a respective multiplexing signal input terminal J, and the multiplexing signal input terminal J is configured to transmit the multiplexing control signal to the sub-pixels P electrically connected to the data line D through a corresponding multiplexing control line 141.

In this way, data signals Vdata from a same multiplexing data signal line 143 may be transmitted to corresponding data lines D through the third switches 142 in different states (including a turn-on state and a turn-off state), so that the display panel 1 may achieve the transmission of the data signal Vdata in a multiplexed manner. In this case, the number of required signal output ports of a source driver chip may be effectively reduced, so that the number of source driver chips required by the display apparatus 100 may be reduced, and a cost of a display apparatus including the display panel 1 may be reduced. The display panel 1 is particularly suitable for a display apparatus with a limited number of source driver chips and a limited receiving space, such as a watch, a bracelet or any other wearable device.

A person skilled in the art can understand that in actual applications, a specific position of each signal line in the gate driver circuit 12 and the multiplexing circuit 14 may be reasonably set according to a shape of the active area A and requirements for functions of the product. Herein, the above embodiments are merely exemplary positions of signal lines in the gate driver circuit 12 and the multiplexing circuit 14, and actual positions of signal lines in the gate driver circuit 12 and the multiplexing circuit 14 are not limited.

It will be noted that, FIG. 6A shows an example in which one multiplexing data signal line 143 corresponds to two data lines D. In some other embodiments, one multiplexing data signal line 143 may also correspond to more than two data lines D, for example, a ratio of the two is 1 to 4, 1 to 6, or the like.

It will be noted that, in order to clearly show the circuits and components in the display panel 1, FIG. 6A only illustrates one multiplexing data signal line 143, and a connection relationship and a positional relationship between this multiplexing data signal line 143, its corresponding data signal input terminal YI, its corresponding multiplexing control terminals J, its corresponding third switches 142, its corresponding multiplexing control lines 141, and its corresponding data lines D. However, this should not be taken as a limitation of the present disclosure.

A working process of the multiplexing circuit 14 will be exemplarily described below with reference to FIGS. 6A and 6B. Herein, the ratio of the multiplexing data signal lines 143 to the data lines D is 1 to 2, and one multiplexing data signal line 143 corresponds to two corresponding data lines D, two sub-pixel columns PC and two third switches. In addition, for ease of description, in a direction from left to right in FIG. 6A, the two sub-pixel columns PC in correspondence with the multiplexing data signal line 143 are referred to as a first sub-pixel column PC1 and a second sub-pixel column PC2. During a process of writing data signals Vdata into a certain sub-pixel row, in a case where the sub-pixel row PR is scanned from left to right, when a data signal Vdata needs to be written into a sub-pixel P in the first sub-pixel column PC1, the third switch 142 corresponding to the first sub-pixel column PC1 is turned on in response to an active level signal transmitted from its corresponding multiplexing control terminal $J_2$, and a data signal Vdata from the multiplexing data signal line 143 is written into the first sub-pixel column PC1. It will be noted that, in this process, the third switch 142 corresponding to the second sub-pixel column PC2 does not receive an active level signal transmitted from its corresponding multiplexing control terminal $J_1$ and is in a turn-off state. Similarly, when a data signal Vdata needs to be written into sub-pixels P in the second sub-pixel column PC2, the third switch 142 corresponding to the first sub-pixel column PC1 does not receive the active level signal transmitted from the multiplexing control terminal $J_2$ and is in a turn-off state, and the third switch 142 corresponding to the second sub-pixel column PC2 is turned on in response to the active level signal transmitted from the corresponding multiplexing control terminal $J_1$.

For example, referring to FIGS. 6A and 6B, the third switch 142 includes a switching transistor M8. A gate of the switching transistor M8 is connected to a corresponding multiplexing control line 141, a first electrode of the switching transistor M8 is connected to a corresponding multiplexing data signal line 143, and a second electrode of the switching transistor M8 is connected to a corresponding data line D.

In some embodiments, as shown in FIGS. 6A, 7A and 8, the display panel 1 further includes a lighting test circuit 16 arranged in the peripheral area S. The lighting test circuit 16 includes a lighting control signal line 161, at least three lighting test signal lines 162, and a plurality of fourth switches 163. The display panel 1 further includes a fourth signal input terminal X4 and at least three fifth signal input terminals X5 (e.g., X51, X52 and X53 shown in FIGS. 7A and 8). The lighting control signal line 161 is electrically connected to the fourth signal input terminal X4, the lighting test signal lines 162 are electrically connected to the fifth signal input terminals X5 in one-to-one correspondence, and each fourth switch 163 is electrically connected to the lighting control signal line 161, a respective lighting test signal line 162 and a respective data line D, and the fourth switch 163 is configured to close a line between the lighting test signal line 162 and the data line D in response to a lighting control signal from the lighting control signal line 161, where the lighting control signal is output by the fourth signal input terminal X4.

Herein, the fourth signal input terminal X4 and the plurality of fifth signal input terminals X5 may be arranged in the bonding region B, and the fourth signal input terminal X4 and the fifth signal input terminals X5 are used to be electrically connected to an external test device, so as to transmit electrical signals, generated during a lighting test of the display panel 1, to the external test device.

Referring to FIGS. 6A, 7A and 8, each fourth switch 163 may be a transistor, in a case where the fourth switch 163 is a P-type transistor, during the lighting test, a low-level signal is transmitted to the fourth signal input terminal X4, so that the fourth switch 163 is turned on, and a current path is formed between the lighting test signal line 162 and the data line D. Sub-pixels P corresponding to the lighting test signal line 162 are driven to emit light according to a lighting test signal transmitted from the lighting test signal line 162, and light-emitting condition of the sub-pixels P is detected through the external test device, so as to detect whether there is a dead pixel among these sub-pixels P.

For example, referring to FIGS. 6A, 7A and 8, the plurality of sub-pixel columns PC include a plurality of red sub-pixel columns $PC_R$, a plurality of green sub-pixel columns $PC_G$, and a plurality of blue sub-pixel columns $PC_B$. The lighting test circuit 16 includes three lighting test signal lines 162, which are electrically connected to data lines D in correspondence with the red sub-pixel columns $PC_R$, data lines D in correspondence with the green sub-pixel columns $PC_G$, and data lines D in correspondence with the blue sub-pixel columns $PC_B$. In this case, the display panel 1 includes three fifth signal input terminals X5, which are X51, X52, and X53.

FIGS. 6A, 7A and 8 illustrate a case where the lighting test signal line 162 and the lighting control signal line 161 are arranged around the active area A that is in a circular shape. A person skilled in the art can understand that, this is merely an example, and in practical applications, positions of the lighting test signal line 162 and the lighting control signal line 161 may be reasonably set according to actual needs.

Some embodiments of the present disclosure provide a display apparatus. As shown in FIG. 1, the display apparatus 100 includes at least one source driver chip 2 for sending data signals Vdata to the data lines D of the display panel 1.

The source driver chip 2 may be directly bonded to the display panel 1 in the bonding region B. For example, the source driver chip 2 and the display panel 1 may be connected through a connecting finger structure in the bonding region B. As another example, referring to FIG. 1, the display panel 1 and a flexible printed circuit board FPC are bonded in the bonding region B, and the source driver chip 2 is connected to the display panel 1 through the FPC. In this case, the source driver chip 2 may be integrated onto the FPC.

The display apparatus 100 has same beneficial effects as the display panel 1. Since the beneficial effects have already been described above, details will not be repeated herein.

In some embodiments, referring to FIGS. 1, 7A and 8, the display apparatus 100 includes the display panel 1 and at least one detection chip 3. Each detection chip 3 is electrically connected to the first detection signal line 151 and the detection control signal line 152 in the bonding region B. For example, in a case where the display panel 1 includes at least one first signal input terminal X1 and at least one second signal input terminal X2, each detection chip 3 is electrically connected to the first detection signal line 151 and the second signal detection line 154 through a corresponding first signal input terminal X1, and is electrically connected to the detection control signal line 152 through a corresponding second signal input terminal X2. Each detection chip 3 is configured to transmit the detection signal to the first detection signal line 151 and transmit the detection control signal to the detection control signal line 152.

For example, as shown in FIG. 1, the detection chip 3 is electrically connected to the display panel 1 through the FPC. As another example, as shown in FIGS. 7A and 8, the detection chip 3 is directly connected to the display panel 1 in the bonding region B, for example, they may be bonded together through a connecting finger structure.

In some embodiments, as shown in FIGS. 7A and 8, each detection chip 3 is further electrically connected to the second detection signal line 154, and is further configured to send the detection signal to the second detection signal line 154.

Referring to FIGS. 1, 2, 7A and 8, some embodiments of the present disclosure provide a crack detection method applicable to the display panel 1 described above, and the crack detection method includes the following S1 to S3.

In S1, the pixel driver circuits 13 of the plurality of sub-pixels P are reset.

It will be noted that, for description of the resetting of the pixel driver circuits 13, reference may be made to the description of the reset period in the detection process of the display panel 1 described above, which will not be repeated herein.

In S2, the detection control signal is transmitted to the at least one first switch 153 through the detection control signal line 152, so as to close a line between the first detection signal line 151 and each first data line D_1. It will be noted that, in the case where the first detection signal line 151 is broken due to a crack in the display panel 1, the line cannot be closed.

In S3, the detection signal is transmitted to the at least one first data line D_1 through the first detection signal line 151.

In this way, in the case where a first detection signal line 151 is broken due to the crack in the display panel 1, the sub-pixel column PC electrically connected to the first data line D_1 emits light; and in the case where there is no crack in the display panel 1, the sub-pixel column PC connected to the first data line D_1 does not emit light. Therefore, it is possible to detect whether there is a crack in the display panel 1 according to the light-emitting condition of the sub-pixel column PC.

The crack detection method has same beneficial effects as the display panel 1.

Since the beneficial effects have already been described above, details will not be repeated herein.

Hereinafter, the crack detection process of the display panel 1 will be described in an overall and exemplary manner with reference to FIGS. 3, 7A and 8. In the following description, it is taken as an example that the first switch 153, the second switch 155, the third switch 142, and the fourth switch 163 are all P-type transistors, and the transistors (i.e., M1 to M7) included in the pixel driver circuit 13 are all P-type transistors.

Referring to FIGS. 1, 7A and 8, in a detection signal writing period of the display panel 1, the at least one detection chip 3 transmits the detection control signal that is a low-level signal to the detection control signal line 152 through the at least one second signal input terminal X2, so that the at least one first switch 153 and the at least one second switch 155 are turned on, and the at least one detection chip 3 transmits the detection signal that is a high-level signal to the first detection signal line 151 and the second detection signal line 154 through the at least one first signal input terminal X1.

It will be noted that in the period, referring to FIGS. 1 and 6A, the source driver chip 2 transmits a high-level signal to the multiplexing control terminal J in the multiplexing circuit 14, so that the third switch 142 is in a turn-off state. Meanwhile, the external test device transmits a high-level signal to the fourth signal input terminal X4, so that the fourth switch 163 is in a turn-off state.

In a case where a lighting test applied to the display panel 1, the sub-pixel rows PR are scanned row by row. For a sub-pixel row PR, the external test device inputs a low-level signal to the display panel 1 through the fourth signal input terminal X4, so that the fourth switch 163 is turned on, and the line between the lighting test signal line 162 and the data line D is closed; and the sub-pixels P corresponding to the data signal input by the lighting test signal line 162 are driven to emit light according to the data signal input by the lighting test signal line 162, and the light-emitting condition of the sub-pixels P is detected through the external test device to detect whether there is a dead pixel (i.e., a sub-pixel P incapable of emitting light) in the plurality of sub-pixels P. In this period, the high-level signal from the multiplexing control terminal J is transmitted to the multiplexing circuit 14, so that the third switch 142 is in the turn-off state.

It can be seen from the above description that, through the above signal input method, it is possible to ensure that normal display function and lighting detection are not affected, and panel crack detection (PCD) is performed.

Input condition of each signal in each period is shown in Table 1 below.

TABLE 1

| Period | Second signal input terminal X2 | First signal input terminal X1 | Multiplexing control terminal J | Fourth signal input terminal X4 |
|---|---|---|---|---|
| Display period | High-level signal | High-level signal | Square-wave signal | High-level signal |
| Lighting detection period of panel section | High-level signal | High-level signal | High-level signal | Low-level signal |
| PCD detection period of module section | Low-level signal | High-level signal | High-level signal | High-level signal |

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, comprising an active area and a peripheral area, the active area being at least partially surrounded by the peripheral area; the display panel comprising:
    a plurality of sub-pixels located in the active area;
    a plurality of data lines located in the active area and electrically connected to the plurality of sub-pixels, the plurality of data lines including at least one first data line and at least one second data line;
    a detection circuit located in the peripheral area, the detection circuit including:
        a first detection signal line detouring along an edge of the active area and being configured to transmit a detection signal;
        a detection control signal line detouring along the edge of the active area and being configured to transmit a detection control signal;
        at least one first switch, wherein the at least one first switch is electrically connected to the first detection signal line, the detection control signal line and the at least one first data line, and is configured to close a line between the first detection signal line and the first data line, in response to the detection control signal;
        a second detection signal line detouring along the edge of the active area;
        at least one second switch, wherein the second detection signal line is arranged between the first detection signal line and the detection control signal line; the at least one second switch is electrically connected to the second detection signal line, the detection control signal line and the at least one second data line, and is configured to close a line between the second detection signal line and the second data line, in response to the detection control signal; and
        at least one crack detection line located in the peripheral area and on a side of the first detection signal line away from the active area, wherein the at least one crack detection line is electrically connected between the first detection signal line and the second detection signal lines.

2. The display panel according to claim 1, wherein the first detection signal line, the second detection signal line, and the detection control signal line are arc-shaped lines.

3. The display panel according to claim 1, wherein the first detection signal line is a one-piece line; and
    the at least one crack detection line includes:
        a first crack detection line located in the peripheral area; and
        a second crack detection line located in the peripheral area, wherein the first crack detection line and the second crack detection line are located on the side of the first detection signal line away from the active area, and are located on different sides of a central axis of the active area; a first terminal of the first crack detection line is electrically connected to a first terminal of the first detection signal line, and a second terminal of the first crack detection line is electrically connected to a first terminal of the second detection signal line; and a first terminal of the second crack detection line is electrically connected to a second terminal of the first detection signal line, and a second terminal of the second crack detection line is electrically connected to a second terminal of the second detection signal line.

4. The display panel according to claim 3, wherein the first crack detection line and the second crack detection line each include:
    a first wire segment, wherein the first wire segment is arc-shaped, detouring along the first detection signal line;
    a second wire segment electrically connected to the first terminal of the second detection signal line, wherein the second wire segment is arc-shaped, and is arranged on a side of the first wire segment away from the active area, detouring along the first wire segment;
    a third wire segment electrically connected between the first wire segment and the second wire segment; and
    a fourth wire segment electrically connected between the first wire segment and the first detection signal line.

5. The display panel according to claim 1, wherein the first detection signal line includes:
    a first detection signal sub-line; and
    a second detection signal sub-line, wherein the first detection signal sub-line and the second detection signal sub-line are located on different sides of a central axis of the active area, respectively;
    the detection circuit further includes:
        a first crack detection line located in the peripheral area; and
        a second crack detection line located in the peripheral area, wherein the first crack detection line and the second crack detection line are located on the side of the first detection signal line away from the active area, and are located on different sides of a central axis of the active area; a first terminal of the first crack detection line is electrically connected to a first terminal of the first detection signal sub-line, and a second terminal of the first crack detection line is electrically connected to a first terminal of the second detection signal line; a first terminal of the second crack detection line is electrically connected to a first terminal of the second detection signal sub-line, and a second terminal of the second crack detection line is electrically connected to a second terminal of the second detection signal line; and a second terminal of the first detection signal sub-line and a second terminal of the second detection signal sub-line are located on different sides of the central axis of the active area and are opposite to each other.

6. The display panel according to claim 5, wherein the first crack detection line and the second crack detection line each include:
    a first wire segment, wherein the first wire segment is arc-shaped, detouring along the first detection signal line;
    a second wire segment electrically connected to the first terminal of the second detection signal line, wherein the second wire segment is arc-shaped, and is arranged on a side of the first wire segment away from the active area, detouring along the first wire segment;
    a third wire segment electrically connected between the first wire segment and the second wire segment; and
    a fourth wire segment electrically connected between the first wire segment and the first detection signal line.

7. The display panel according to claim 1, wherein the at least one crack detection line includes:
  a first crack detection line; and
  a second crack detection line, wherein the first crack detection line and the second crack detection line are located on the side of the first detection signal line away from the active area, and are located on different sides of a central axis of the active area, and both are double broken lines.

8. The display panel according to claim 1, further comprising a bonding region located in the peripheral area, wherein the detection circuit further includes:
  at least one first signal input terminal arranged in the bonding region, wherein the at least one first signal input terminal is electrically connected to the first detection signal line and the second detection signal line, and is configured to transmit the detection signal to the first detection signal line and the second detection signal line; and
  at least one second signal input terminal arranged in the bonding region, wherein the at least one second signal input terminal is electrically connected to the detection control signal line, and is configured to transmit the detection control signal to the detection control signal line.

9. The display panel according to claim 8, wherein
  the at least one first switch and the at least one second switch are located on a side of the active area away from the bonding region, and are arranged along the detection control signal line.

10. The display panel according to claim 8, further comprising:
  a plurality of multiplexing data signal lines located in the peripheral area, detouring along the edge of the active area;
  a plurality of multiplexing sub-circuits located in the peripheral area; and
  a plurality of data signal input terminals located in the bonding region and configured to output data signals, wherein the multiplexing data signal lines are electrically connected to the data signal input terminals in one-to-one correspondence; and one multiplexing sub-circuit is electrically connected to one multiplexing data signal line and at least two data lines, and the multiplexing sub-circuit is configured to transmit at least two data signals to the at least two data lines in a time-sharing manner.

11. The display panel according to claim 10, wherein the multiplexing sub-circuit includes:
  a plurality of multiplexing control lines located in the peripheral area, detouring along the edge of the active area;
  a plurality of third switches; and
  a plurality of multiplexing control terminals located in the bonding region, wherein the multiplexing control lines are electrically connected to the multiplexing control terminals in one-to-one correspondence, and one third switch is electrically connected to one multiplexing control line, one multiplexing data signal line and one data line, and the multiplexing control line is configured to close a line between a corresponding multiplexing data signal line and the data line in a data writing period of sub-pixels that corresponds to the data line, in response to a multiplexing control signal from the multiplexing control line.

12. The display panel according to claim 1, wherein the active area includes at least one arc-shaped edge.

13. The display panel according to claim 1, wherein the first detection signal line detours along a side of the detection control signal line away from the active area.

14. A display apparatus, comprising:
  the display panel according to claim 1, wherein the display panel further includes a bonding region located in the peripheral area; and
  at least one detection chip, wherein the at least one detection chip is electrically connected to the first detection signal line and the detection control signal line in the bonding region, and is configured to transmit the detection signal to the first detection signal line and the detection control signal line.

15. The display apparatus according to claim 14, wherein the detection circuit further includes:
  a second detection signal line; and
  at least one second switch, wherein the second detection signal line is arranged between the first detection signal line and the control signal line; the at least one second switch is electrically connected to the second detection signal line, the detection control signal line, and the at least one second data line, and is configured to close a line between the second detection signal line and the second data line, in response to the detection control signal; and
  the at least one detection chip is further electrically connected to the second detection signal line in the bonding region, and is further configured to output the detection signal to the second detection signal line.

16. The display apparatus according to claim 15, wherein the detection circuit further includes:
  at least one first signal input terminal; and
  at least one second signal input terminal, wherein the at least one detection chip is electrically connected to the first detection signal line, the second detection signal line, and the detection control signal line through the at least one first signal input terminal and the at least one second signal input terminal.

* * * * *